US009617766B2

(12) United States Patent
Eckberg et al.

(10) Patent No.: US 9,617,766 B2
(45) Date of Patent: Apr. 11, 2017

(54) COMPONENT AND LOW PROFILE FLEXIBLE LATCH ASSEMBLY

(71) Applicant: International Business Machines Corporation, Armonk, NY (US)

(72) Inventors: Eric A. Eckberg, Rochester, MN (US); Jessica R. Eidem, Rochester, MN (US); James D. Gerken, Zumbro Falls, MN (US); Rebeccah J. Vossberg, Rochester, MN (US); Daniel A. Wright, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/983,687

(22) Filed: Dec. 30, 2015

(65) Prior Publication Data

US 2016/0102486 A1    Apr. 14, 2016

Related U.S. Application Data

(63) Continuation of application No. 14/025,960, filed on Sep. 13, 2013.

(51) Int. Cl.
*E05C 1/04* (2006.01)
*E05C 3/14* (2006.01)
*H05K 5/02* (2006.01)

(52) U.S. Cl.
CPC ............ *E05C 3/14* (2013.01); *H05K 5/0221* (2013.01); *Y10T 292/1051* (2015.04)

(58) Field of Classification Search
CPC .... H05K 5/0221; Y10T 292/1051; E05C 3/14
See application file for complete search history.

(56) References Cited

U.S. PATENT DOCUMENTS 4,390,198 A    6/1983  Selinko
4,955,159 A *  9/1990  Rogers ................... E05C 17/04
                                               292/226

(Continued)

FOREIGN PATENT DOCUMENTS

EP         628682 A1     5/1994
WO    2012047606 A2     4/2012

OTHER PUBLICATIONS

Cisco, "Chapter 2: Installing the Server", Cisco: UCS C220 Server Installation and Service Guide, © 2013 Cisco Systems, Inc. http://www.cisco.com/en/US/docs/unified_computing/ucs/c/hw/C220/install/install.html.

(Continued)

*Primary Examiner* — Kristina Fulton
*Assistant Examiner* — Thomas Neubauer
(74) *Attorney, Agent, or Firm* — Joseph W. Cruz

(57) ABSTRACT

Latch assembly including a latch arm, having first and second length edges and first and second width edges. The latch arm includes a latch pawl, a pivot connector, and a stabilizing member, positioned in a plane. The latch pawl connected to the first width edge and providing spring force resisting deflection non-parallel to the plane. The pivot connector and stabilizing member formed within an area of the latch arm. The stabilizing member extending distally relative to the second width edge to the pivot connector, and providing spring force resisting deflection parallel to the plane. The component and latch assembly including a component having first and second faces being adjacent and perpendicular. The latch arm rotatably mounted on the second face between latched and unlatched positions. Assembly including an embossment positioned to deflect the latch pawl during latching so the latch arm sits raised upon the embossment in the latched position.

1 Claim, 6 Drawing Sheets

(56) References Cited

U.S. PATENT DOCUMENTS

| | | |
|---|---|---|
| 5,632,517 A | 5/1997 | Paulik et al. |
| 5,727,825 A | 3/1998 | Spurr |
| 5,984,385 A | 11/1999 | Shtarkman et al. |
| 5,997,053 A | 12/1999 | Marquez |
| 6,109,671 A | 8/2000 | Roncin et al. |
| 6,956,745 B2 | 10/2005 | Kerrigan et al. |
| 7,507,103 B1 | 3/2009 | Phillips et al. |
| 8,141,735 B2 | 3/2012 | Woods et al. |
| 8,376,418 B2 | 2/2013 | Osvatic et al. |
| 8,585,426 B2 | 11/2013 | Zerebilov et al. |
| 8,931,813 B2 * | 1/2015 | Juga ............... E05B 13/004 292/194 |
| 2003/0052488 A1 * | 3/2003 | Heller ............... E05B 81/20 292/63 |
| 2005/0101176 A1 | 5/2005 | Kachlic |
| 2011/0110711 A1 | 5/2011 | Basley et al. |
| 2012/0287573 A1 | 11/2012 | Anguiano-Wehde et al. |
| 2015/0076839 A1 | 3/2015 | Eckberg et al. |

OTHER PUBLICATIONS

Detwiler, B., "IBM System x3400 M3 small-office server teardown", TechRepublic.com, Posted Mar. 12, 2012, © 2013 CBS Interactive. http://www.techrepublic.com/pictures/ibm-system-x3400-m3-small-office-server-teardown/1/.

HP Support Center, "HP ProLiant SL170s G6 Server—Advisory: ProLiant SL6000 Scalable System—Plastic Latch on the SL6000 Server Tray May Break," Support Communication—Customer Advisory, (Last Updated May 5, 2011), © 2013 Hewlett-Packard Development Company, L.P. http://h20000.www2.hp.com/bizsupport/TechSupport/Document.sp?lang=en&cc=us&taskId=125&prodSeriesId=4286343&prodTypeId=15351&objectID=c02826810.

* cited by examiner

COMPONENT AND LOW PROFILE FLEXIBLE LATCH ASSEMBLY

BACKGROUND

The present disclosure relates to the field of component latches. More specifically, the present disclosure relates to electronic component latches, the component having electrical signal connectors.

In general, component latches may serve a number of purposes at least including locating a component properly within a bay, holding a component within a component bay, and docking electrical signal connectors of the component to the component bay. As the complexity of components increases, and the cost of replacement component increases, the need to properly latch those components similarly increases.

SUMMARY

The present disclosure relates generally to a latch assembly and component and latch assembly. The latch assembly may include a latch arm, having a first length edge and a second length edge and a first width edge and a second width edge. The latch arm may include a latch pawl, a pivot connector, and a stabilizing member, being positioned in a plane. The latch pawl being may be connected to the first width edge of the latch arm. The latch pawl may provide spring force resisting deflection non-parallel to the plane. The pivot connector may be formed within an area of the latch arm. The stabilizing member may be formed within the area of the latch arm and extend distally relative to the second width edge to connect to the pivot connector. The stabilizing member may provide spring force resisting deflection parallel to the plane.

The component and latch assembly may include a component, having a first face and a second face, the first and second faces being adjacent, perpendicular, and having a shared edge. The component may be inserted into a component bay having a latch pawl pin. The assembly may also include one or more connectors positioned on the first face. The assembly may include a latch arm, having a first length edge and a second length edge and a first width edge and a second width edge. The latch arm may be mounted on the second face of the component. The latch arm may be rotatable between a latched position and an unlatched position. The length edges may be parallel to the shared edge in the latched position and non-parallel to the shared edge in the unlatched position.

The latch arm may also include a latch pawl, a pivot connector, and a stabilizing member, being positioned in a plane. The latch pawl may be connected to the first width edge of the latch arm. The pivot connector may be formed within an area of the latch arm. The stabilizing member may be formed within the area of the latch arm and may extend distally from the second width edge to connect to the pivot connector. The latch pawl may provide spring force resisting deflection non-parallel to the plane. The stabilizing member may provide spring force resisting deflection parallel to the plane. The stabilizing member may also be a toothed stabilizing member, having one or more teeth, forming one or more pockets within the area of the latch arm. The pivot connector may be a toothed pivot connector, having an inner and outer circumference, and having one or more teeth forming one or more pockets within the area of the latch arm, and positioned on the outer circumference of the toothed pivot connector.

The component and latch assembly may also include an embossment positioned on the component to deflect the latch pawl during latching of the latch arm such that the latch arm sits raised upon the embossment in the latched position. The latch assembly and the component and latch assembly may also be constructed where the latch arm, stabilizing member, pivot connector, and latch pawl are constructed from a single piece of material. The latch arm, stabilizing member, pivot connector, and latch pawl may also be made from spring steel.

The latch assembly and the component latch assembly may be constructed such that the stabilizing member and pivot connector of the assembly define an opening which traces the stabilizing member and pivot connector and is located within the area of the latch arm. Damping material may at least partially fill the opening. The damping material may have a durometer generally in the range of 15 to 70.

The damping material may be one or more selected from the group consisting of room temperature vulcanizing epoxy, room temperature vulcanizing silicone, room temperature vulcanizing rubber, and grease. The component and latch assembly may further include a handle, connected to the latch arm and positioned on the second width edge. The assembly may also include a mounting bracket, connected to the second face, and positioned so that the latch arm is sandwiched between the mounting bracket and the second face.

The component and latch assembly may also include a handle pawl pin connected to the mounting bracket, and a handle pawl connected to the handle. The handle may be rotatable between a secured position and an unsecured position where the handle pawl and the handle pawl pin secure the latch arm from rotation in the secured position.

DETAILED DESCRIPTION

Figure 1:
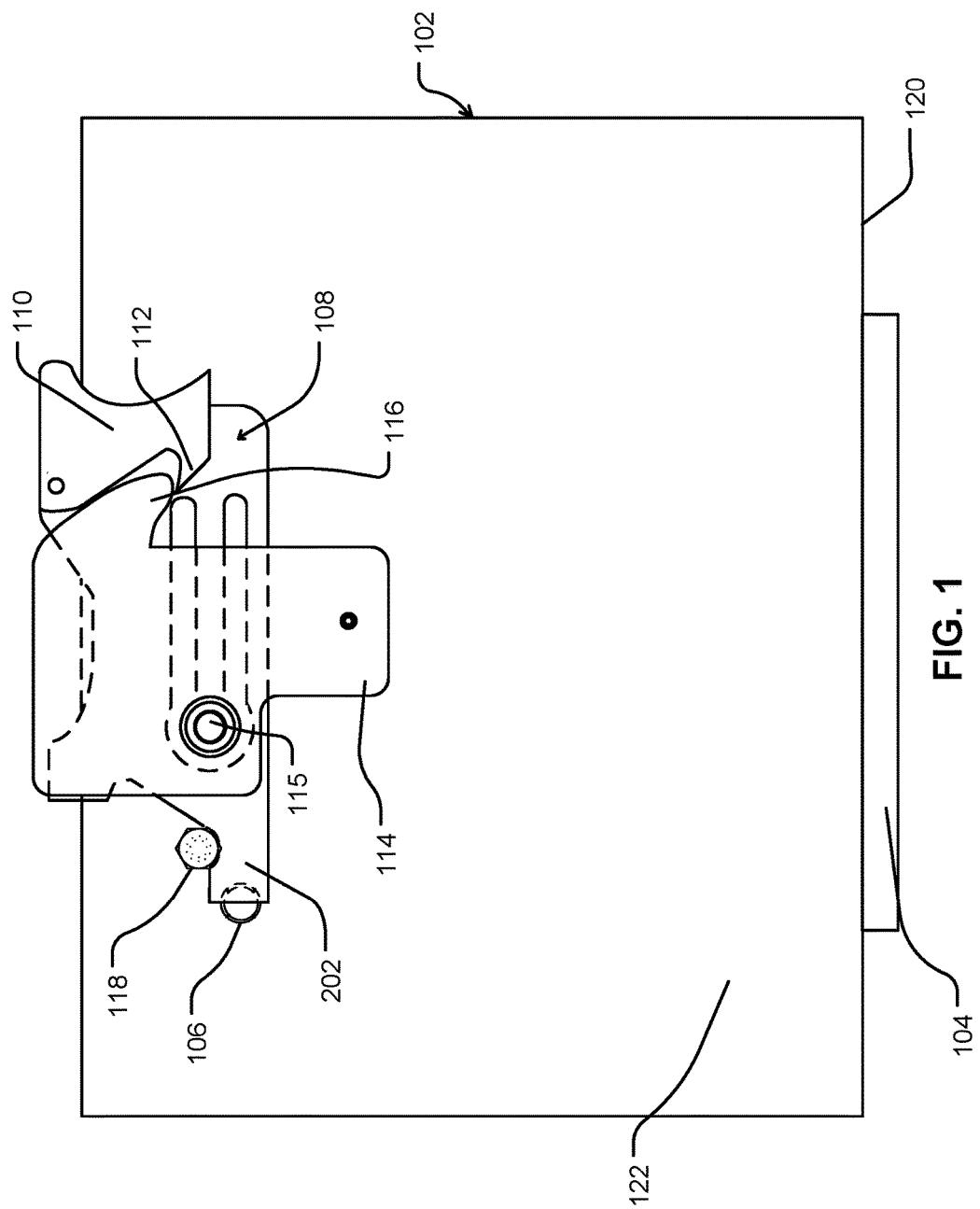
FIG. 1 is a view of an embodiment of a component and latch assembly showing the face of the component having latch elements and a latch arm positioned in the latched position.

In the following description, reference is made to the accompanying drawings which show by way of illustration various examples by which the disclosure may be used. Other examples of the disclosure may be used, as structural and operational changes may be made without departing from the scope of the present disclosure.

While the same nomenclature and same numbers may be used to identify elements throughout the disclosure, this practice is not intended to limit the scope of the disclosure. Identified elements in one figure may not be identical to other same named or identified elements in other figures.

The present disclosure, in some embodiments, relates to latching components within component bays or other chassis. Specifically, the disclosure relates to latching components having one or more connectors, docking the one or more connectors within a component bay, and allowing for secure yet flexible docking between the component bay and the one or more connectors.

In some embodiments, the one or more connectors may transmit and receive electrical signals from the component bay. The flexible docking of electrical connectors may reduce the stress of external forces on the one or more connectors, which may in turn reduce the likelihood of the electrical connectors becoming under-docked, over-docked, or repeatedly docking and undocking. Reducing the likelihood of these events may slow deterioration of the component and of the one or more connectors.

Other embodiments may be used for the same useful purpose to latch a component and flexibly dock non-electrical connectors within component bays while reducing stresses of vibrations, shocks, or other forces upon the one or more connectors. Other embodiments may also be used for the same useful purpose to latch a component flexibly, within component bays or other chassis, which do not have connectors.

The component and latch assembly may include a component, having a first face and a second face. The first and second faces may be adjacent, perpendicular and may have a shared edge. The assembly may include one or more connectors positioned on the first face. The assembly may also include a latch arm having a latch pawl, an unlatch pawl, a stabilizing member, and a pivot connector. The assembly may further include an embossment.

The one or more connectors may be positioned on the first face. The latch arm may have a first length edge and a second length edge, a first width edge and a second width edge. The latch arm may be mounted on the second face, and may be rotatable between a latched position and unlatched position, the length edges being parallel to the shared edge in the latched position and non-parallel to the shared edge in the unlatched position.

The latch pawl may be located at the first width edge of the latch arm. The pivot connector may be formed within an area of the latch arm. The stabilizing member may be formed within the area of the latch arm and may extend distally from the second width edge and to the pivot connector. The stabilizing member and pivot connector may also define an opening which traces the stabilizing member and pivot connector, and is located within the area of the latch arm. The stabilizing member and pivot connector may also be toothed, having one or more teeth. The embossment may be positioned on the component to deflect the latch pawl during latching of the latch arm such that the latch arm sits raised upon the embossment in the latched position.

The component and latch assembly may further include a handle, an unlatch pawl, a mounting bracket, a handle pawl, a handle pawl pin, damping material, and a component bay having a latch pawl pin. The handle may be connected to the latch arm and positioned on the second width edge, and may be rotatable between a secured and unsecured position. The unlatch pawl may be connected to the latch arm and positioned on the first width edge. The mounting bracket may be connected to the second face and positioned so that the latch arm is sandwiched between the mounting bracket and the second face. The handle pawl may be connected to the handle where the handle and handle pawl pin secure the latch arm from rotation in the secured position.

Figure 2:
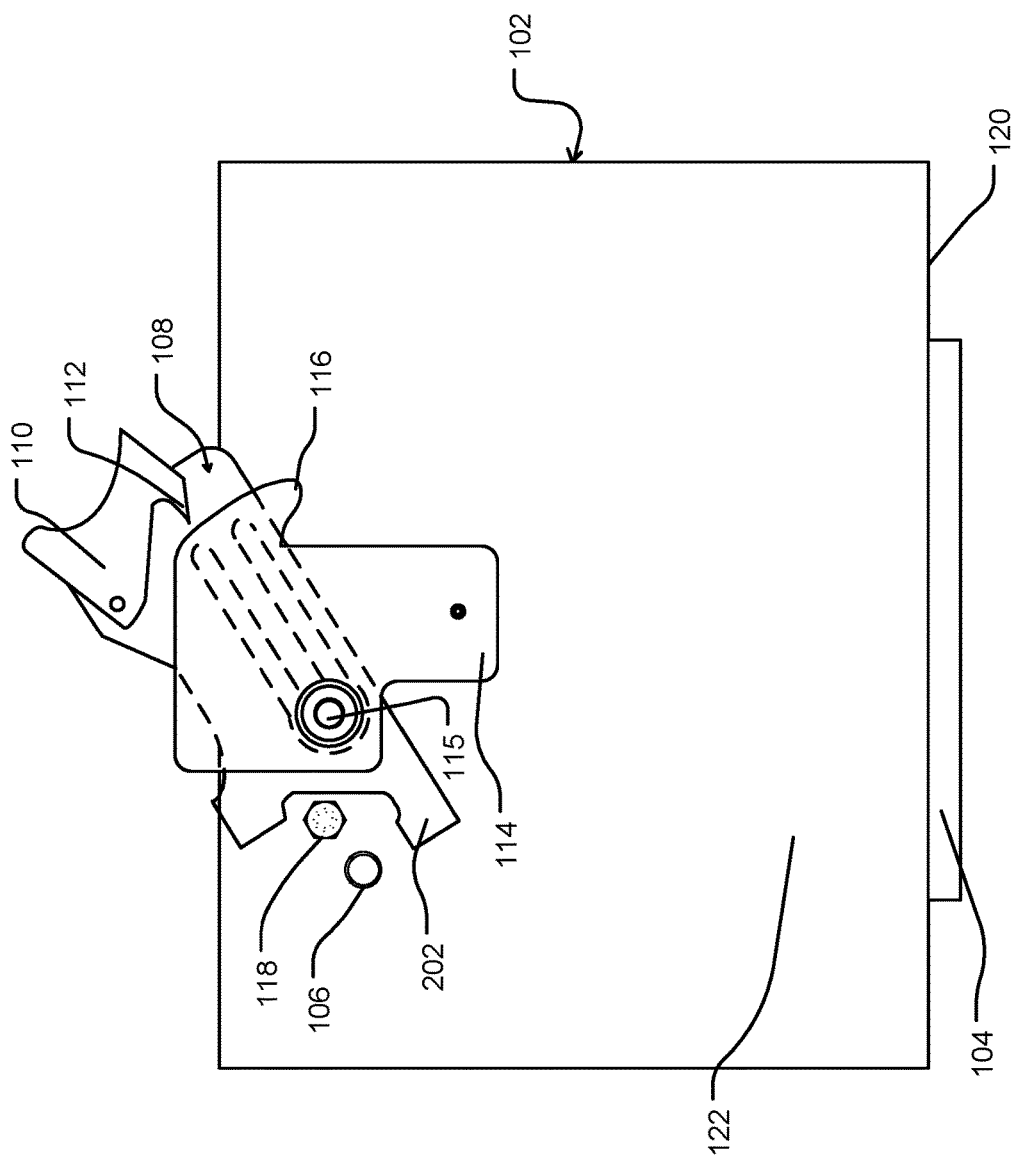
FIG. 2 is a view of an embodiment of a component and latch assembly showing the face of the component having latch elements and a latch arm positioned in the unlatched position.

Referring now to FIGS. 1 and 2, a front view of an embodiment, relative to a latch arm 108, can be seen including a component 102, one or more connectors 104, an embossment 106, the latch arm 108 pivotally mounted upon the component 102, a handle 110, a handle pawl 112, a mounting bracket 114, a handle pawl pin 116, and a latch pawl pin 118. In FIG. 1, an embodiment can be seen where the latch arm 108 is in the latched position. In FIG. 2, an embodiment can be seen where the latch arm 108 is in the unlatched position.

The component 102 may be insertable into a component bay, and may have at least two faces, a first face 120 and a second face 122, which may be adjacent, perpendicular and have a shared edge. The type of component 102 used may include a power supply, a fan, a node, or other type of component 102 which is insertable into a component bay.

The component 102 may include one or more connectors 104, positioned externally upon the component 102 such that the one or more connectors 104 may be connected to a component bay, not shown. In at least FIGS. 1 and 2, an embodiment can be seen where the one or more connectors 104 are positioned on the first face 120 the component 102. However in other embodiments the one or more connectors 104 may be positioned on the second face 122, or on other faces or areas of the component 102.

The one or more connectors 104 may include electrical signal connectors, optical signal connectors, or other types of connectors which transmit inputs, outputs, or other signals. In some embodiments however, the one or more connectors 104 may include non-electronic connectors which do not transmit signals but may connect the component 102 to the component bay when the component 102 is inserted.

Figure 3:
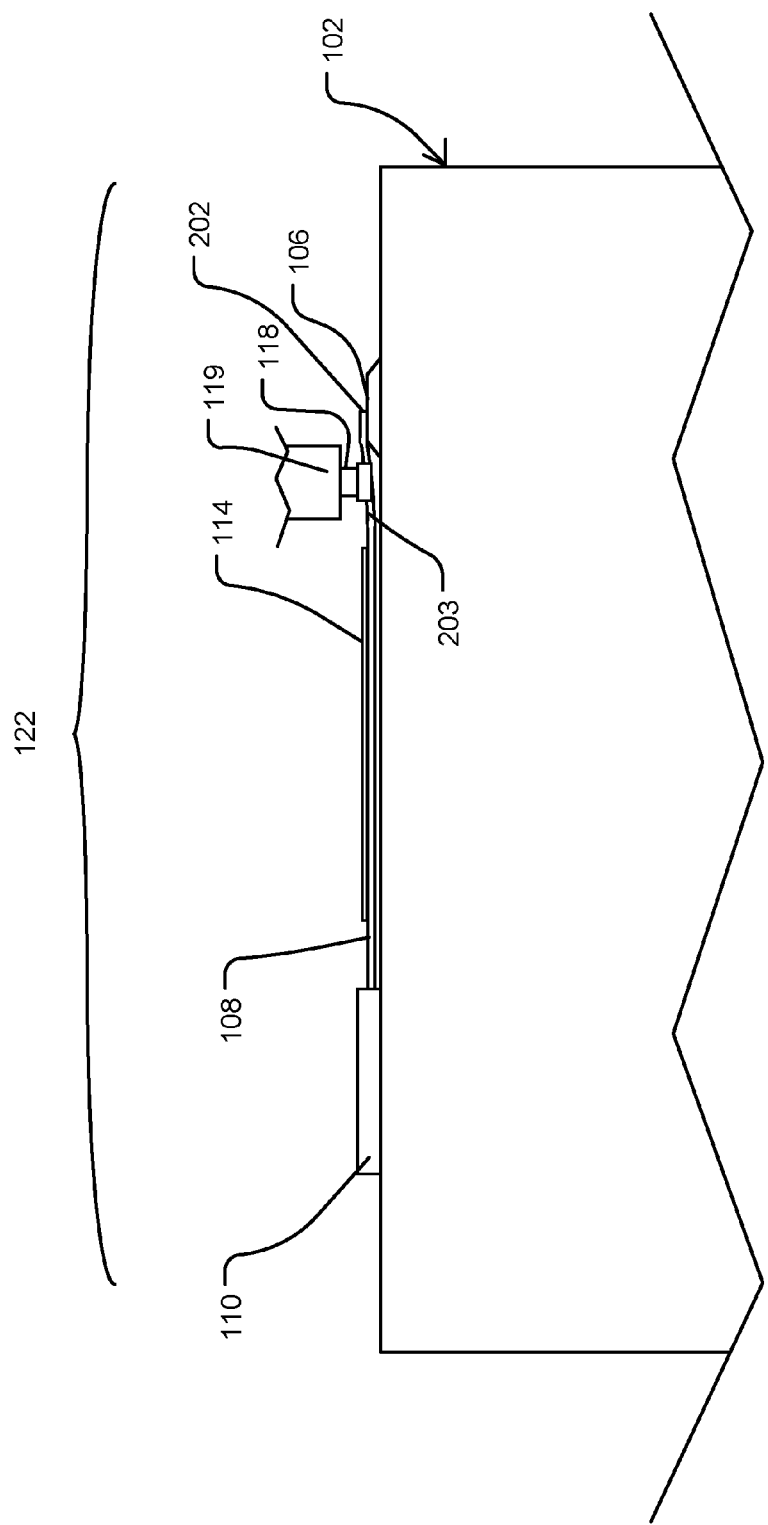
FIG. 3 is a view of an embodiment of a component and latch assembly showing the top view of latch elements and the embossment deflecting the latch pawl up to lie raised upon the embossment in the latched position.

Referring now to FIGS. 1, 2, and 3, the embossment 106 may be a raised portion, relative to a face of the component 102, which may deflect the latch pawl 202 into the latch pawl pin 118. In FIG. 3 an edge view of an embodiment can be seen. In at least one embodiment, the embossment 106 may be a part of the second face 122 of the component 102 which is punched out and upwards to form a raised area having an edge which is at least partially sloped. In other embodiments the embossment 106 may be a part of the second face 122 of the component 102 which is molded upwards to form a raised area. In other embodiments, the embossment 106 may be a piece of material separate from the component 102 which is connected to the second face 122 component 102.

The embossment 106 may be positioned on the same of the component 102 on which the latch arm 108 is mounted. In at least FIGS. 1, 2, and 3, an embodiment is shown where the embossment 106 and latch arm 108 are mounted on the second face 122. However, the embossment may be positioned on other faces of the component. The embossment 106 may be positioned so that it deflects the latch pawl 202 over the edge of the embossment 106 and up to lie raised upon the embossment 106 when the latch arm 108 is in the latched position.

The edge of the embossment 106 may have one or more edges which slope to the surface of the face on which the embossment 106 is mounted. In at least FIGS. 1, 2, and 3 an embodiment is shown where the embossment 106 is mounted on the second face 122 and which is sloped on all edges of the embossment 106.

Referring now to FIG. 3, the height of the embossment 106 may determine the extent of the deflection of the latch pawl 202 in a direction normal to second face 122, and may influence the spring force applied by the deflected latch arm 108. Further, the height of the embossment 106 may provide sufficient deflection of the latch pawl 202 to engage a latch pawl pin 118, typically an aspect of a component bay 119 or chassis as seen in FIG. 3. In an embodiment, the embossment 106 may be raised two millimeters relative to the second face 122.

Deflecting the latch pawl 202 up the embossment 106 to engage a latch pawl pin 118 may allow the latch arm 108 to be placed close to the surface of the component 102 while mounted while also engaging the latch pawl pin 118. The latch pawl pin 118 may extend towards the component 102 from the component bay 119. This may allow the latch pawl 202 to decrease the distance between the one or more connectors 104 and the location of the force applied by the latch pawl 202 and latch pawl pin 118. Reducing the distance between the one or more connectors 104 and the location of the force applied may more evenly distribute the force applied among the one or more connectors 104, and may reduce the likelihood of partial undocking of the component 102.

Figure 4:
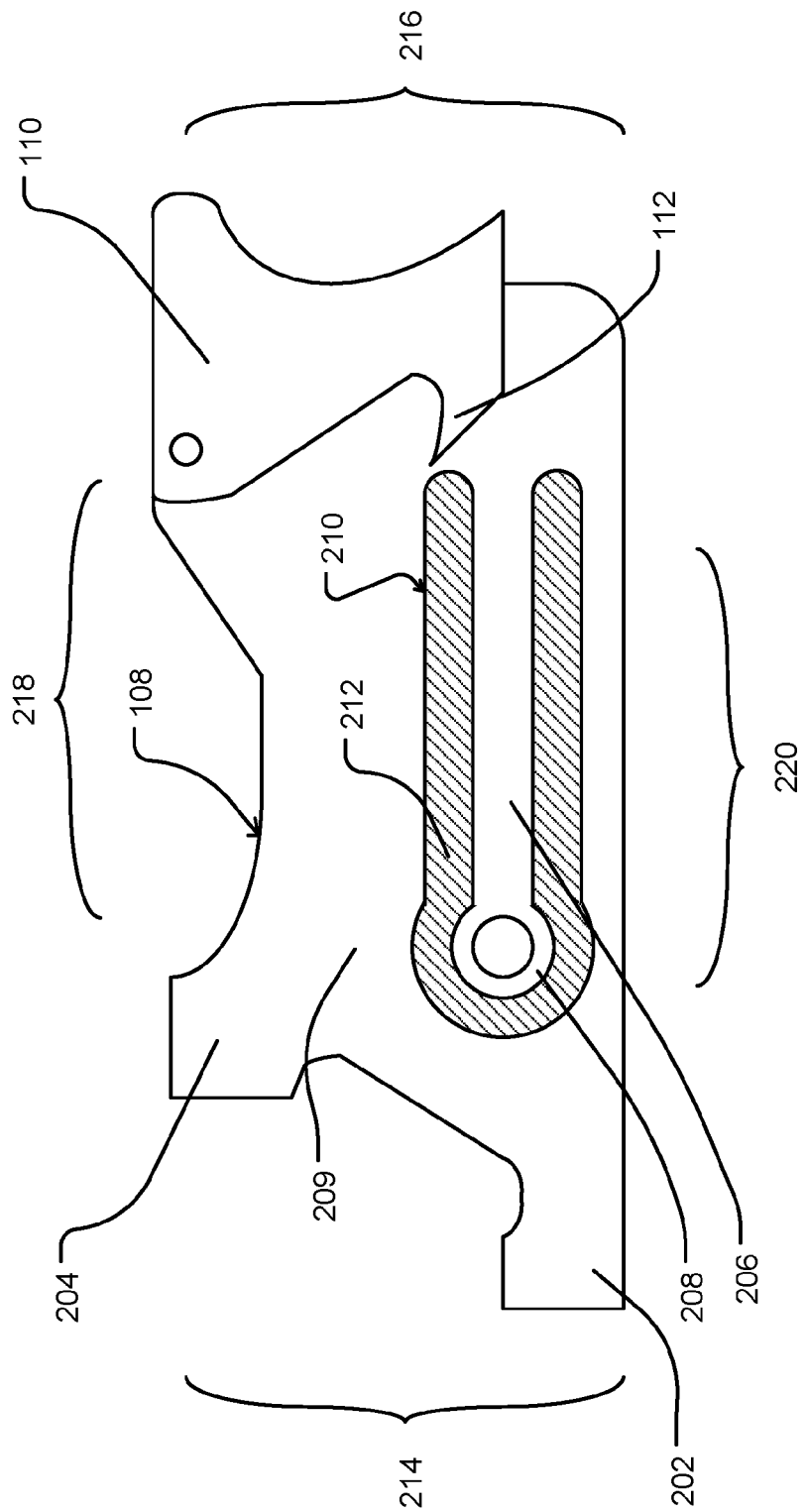
FIG. 4 is a view of an embodiment of the latch assembly.
Figure 5:
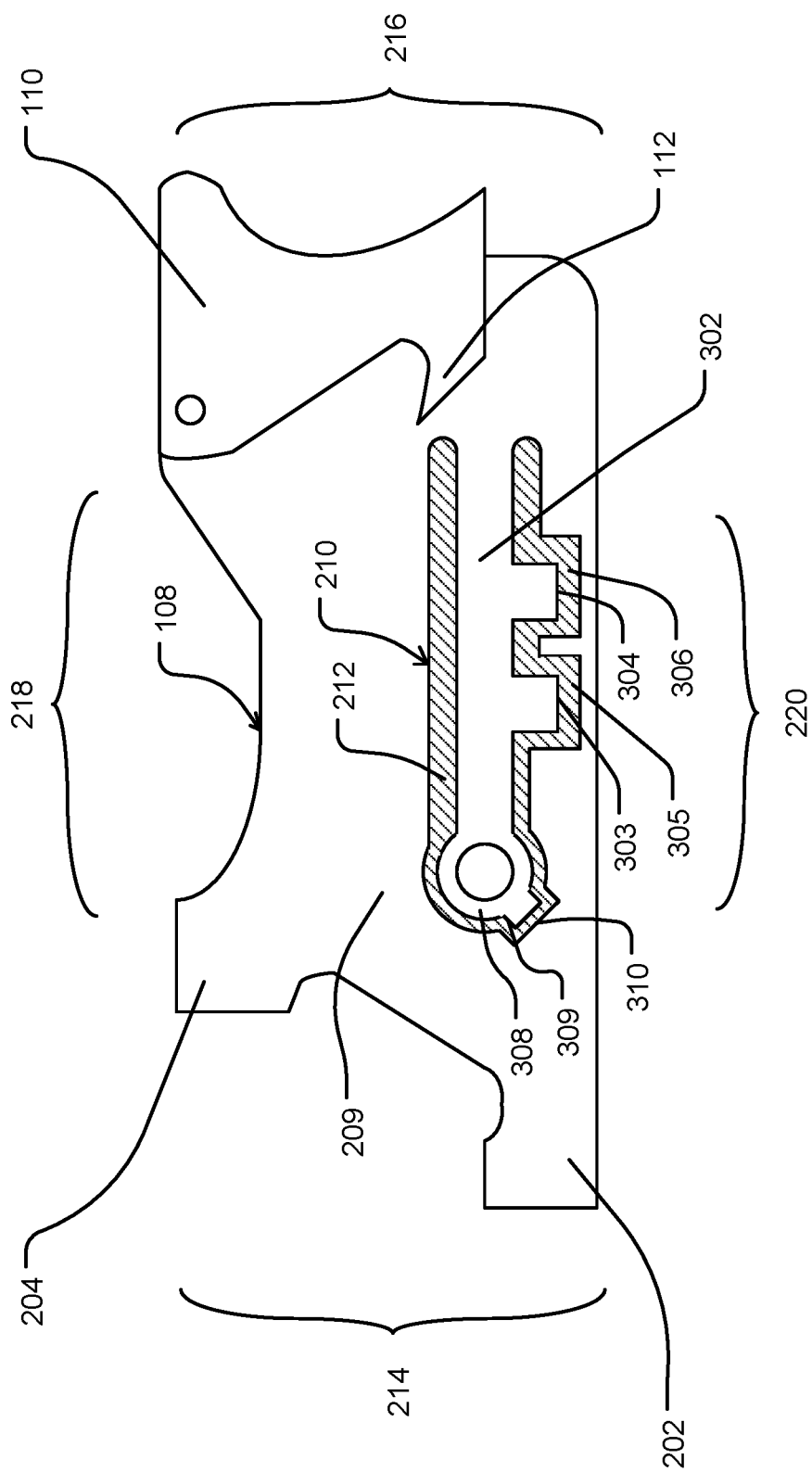
FIG. 5 is a view of an embodiment of the latch assembly having a toothed stabilizing member and a toothed pivot connector.

Referring back again to FIGS. 1 and 2, the latch arm 108 may be mounted externally at an axis of pivot 115 on the component 102 and may pivot between the latched position, as shown in FIG. 1, and the unlatched position as shown in FIG. 2. The latch arm 108 may be constructed to have a planar shape, and may have a first width edge 214 and a second width edge 216, and a first length edge 218 and a second length edge 220. Referring to FIGS. 4 and 5, the latch arm may include the latch pawl 202, an unlatch pawl 204, a stabilizing member 206, and a pivot connector 208. These elements and the latch arm 108 may be positioned in a plane.

The latch arm 108 may be positioned on the second face 122 of the component 102. However, the latch arm 108 may also be positioned on the first face 120 or another face of the component 102. The latch arm 108 may provide a spring force resisting deflection of the latch arm 108. In at least FIG. 4 an embodiment may be seen where the latch arm 108 has spring force in at least two directions. In FIG. 4, the latch pawl 202 may provide spring force when deflected normal to the plane of the latch arm 108, and the stabilizing member 206 may provide spring force when deflected parallel to the plane of the latch arm.

The material from which the latch arm 108 is constructed from may be a source of the spring force. In at least one embodiment, the latch arm 108 may be constructed from pre-tempered spring steel. Spring steel may be adapted to produce a desired deflection spring force which depends upon the shape, thickness and size of the latch arm 108. In an embodiment, the spring force may be adapted by scaling the thickness of the latch arm 108 up or down to achieve a desired spring force. In at least one other embodiment, a spring force of 15 pounds for a travel of 2 millimeters was achieved. Other materials may be used for the same useful purpose however, including plastic, metal, or other materials which may provide spring force when deflected.

The latch arm 108 may be constructed as a single piece of material. In one embodiment, the latch arm 108 may be stamped out from a single piece of spring steel. However the latch arm 108 may also be constructed from multiple pieces of material and fastened together with rivets screws, roll pins, or other fasteners.

The handle 110 may be constructed to provide a section by which a user may pivot the latch arm 108 between the latched position, as shown in FIG. 1, to the unlatched position, as shown in FIG. 2. The handle 110 may be connected to the latch arm 108 at the first width edge 214 or the second width edge 216 of the latch arm 108. In at least FIGS. 1 and 2, an embodiment can be seen where the handle 110 is connected to the second width edge 216. The handle 110 may also be connected at other locations on the latch arm 108 which may allow the latch arm 108 to pivot while mounted upon the component 102.

The handle 110 may be constructed as a continuous extension of the latch arm 108 or as a separate piece which is fastened to the latch arm 108. The handle 110 may also be pivotally fastened to the latch arm 108, and may include a handle pawl 112 which may secure the latch arm 108 in the latched position via the handle pawl pin 116. Securing the latch arm 108 may reduce the likelihood that the latch arm 108 will involuntarily disengage from the latched position.

In at least FIGS. 1 and 2, an embodiment of the handle 110 may be seen which includes a handle pawl 112 where the handle pawl 112 may engage with a mounting bracket 114 to secure the securing latch 108 in the latched position.

Figure 6:
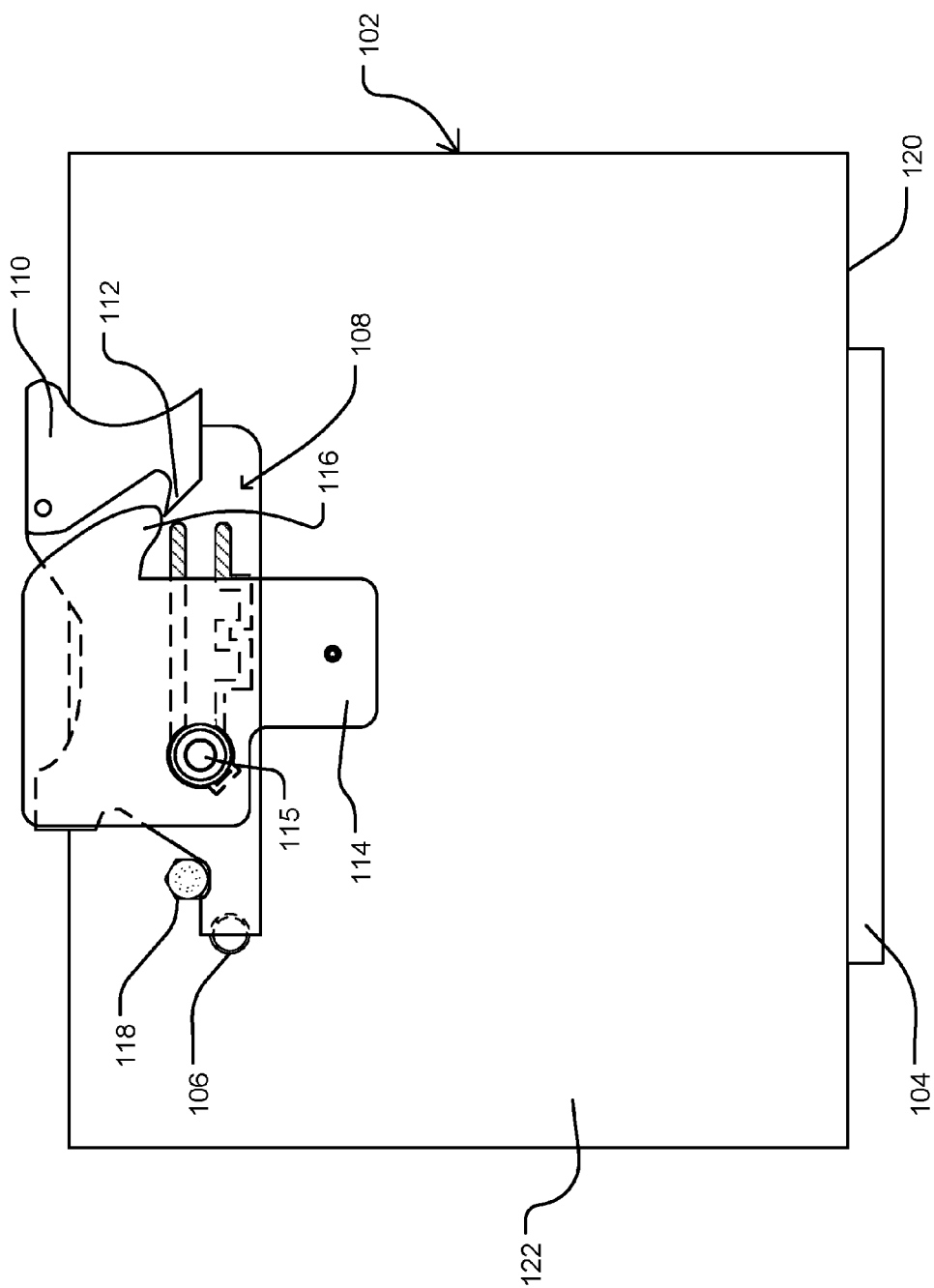
FIG. 6 is a view of an embodiment of a component and latch assembly showing the face of the component having latch elements, where the latch arm has a toothed stabilizing member and a toothed pivot connector.

Referring now to FIGS. 1, 2, and 6 The mounting bracket 114 may allow the latch arm 108 to be pivotably mounted on the component 102. The mounting bracket 114 may be fastened to the component 102. The mounting bracket 114 may provide a surface to pivotally mount the latch arm 108.

The mounting bracket 114 may be connected to the same face as the latch arm 108. In at least FIGS. 1 and 2, the mounting bracket is connected to the second face 122. The mounting bracket 114 may also be positioned adjacent and parallel to the latch arm 108 so that the latch arm 108 is sandwiched between the mounting bracket 114 and the component 102. The mounting bracket 114 may be further connected to the latch arm 108. The mounting bracket 114 may also have a raised portion and a lowered portion, relative to the second face 122 of the component 102. The raised portion and the lowered portion may allow the mounting bracket 114 to simultaneously be connected to the component 102, via the lowered portion, and to the latch arm 108, via the raised portion. The lowered portion and the raised portion may provide clearance for the latch arm 108 from the surface of the component 102.

The mounting bracket 114 may be made from various materials including metal, plastic, or other materials which may allow the mounting bracket 114 to be fastened to the component 102. The mounting bracket 114 may have a handle pawl pin 116 which may provide a pin for the handle pawl 112 to secure the latch arm 108 when the latched arm is in the latched position as shown in FIG. 1.

Referring now to FIGS. 1, 2, 4, and 5, various alternative embodiments can be seen including a handle 110, a handle pawl 112, and a latch arm 108 including a latch pawl 202, an unlatch pawl 204, a stabilizing member 206, a pivot connector 208, and damping material 212.

The latch pawl 202 may secure the latch arm 108 and the component 102 within a component bay. The latch pawl 202 may be positioned at the first width edge 214 of the latch arm 108. The latch pawl 202 may be positioned such that the latch arm 108 is pivotable when the component 102 is inserted into a component bay. The latch pawl 202 may further be positioned so that the latch pawl 202 is deflected over and sits raised upon the embossment 106 when the latch arm 108 is in the latched position.

Referring now to FIG. 3, deflecting the latch pawl 202 up the embossment 106 to engage a latch pawl pin 118 may allow the latch arm 108 to be placed close to the surface of the component 102 while mounted, while also engaging the latch pin 114, which may extend towards the component 102 from the component bay 119. The latch pawl 202 is deflected and bends at an area of deflection 203 so that the latch pawl sits raised upon the embossment 106 and engages the latch pawl pin 118. Engaging the latch pawl pin 118 may decrease the distance between the one or more connectors 104 and the location of the force applied by the latch pawl 202 and latch pawl pin 118. Reducing the distance between the one or more connectors 104 and the location of the force applied may more evenly distribute the force applied among the one or more connectors 104, and may reduce the likelihood of partial undocking of the component 102.

The latch pawl 202 may be constructed to provide a spring force when the latch pawl 202 is deflected non-parallel to the plane of the latch arm 108. The material from which the latch pawl 202 is constructed from may provide a source of such spring force. In at least one embodiment, the latch pawl 202 was constructed from pre-tempered spring steel.

The spring force of the latch pawl 202 may allow for the component 102 to have compliance and flexibility against external shocks, vibrations, or other forces when inserted and latched within a component bay. Compliance and flexibility in the component bay may reduce the stress on the one or more connectors 104 while connected in the component bay.

Spring steel may be adapted to produce a desired spring force from deflection depending upon the shape, thickness and size of the latch pawl 202. In an embodiment, the spring force may be adapted by scaling the thickness of the latch pawl 202 up or down to achieve a desired spring force. In at least one other embodiment, a spring force of 15 pounds for a travel of 2 millimeters was achieved. Other materials may be used for the same useful purpose however, including plastic, metal, or other materials which may provide spring force when deflected.

The latch pawl 202 may be constructed as an extension of the latch arm 108 so that a single piece of material makes up the latch pawl 202 and the latch arm 108. This may lower the cost and complexity of manufacture and may allow for a lower profile of the latch arm 108 and latch pawl 202. However the latch pawl 202 may also be constructed as a separate piece which is fastened to the latch arm 108 by one or more rivets, screws, roll pins, or other fasteners.

The unlatch pawl 204 may act as a lever when the latch arm 108 is pivoted into the unlatch position to assist in disconnecting connectors 104 connected to the component bay. The lever action of the unlatch pawl 204 may be provided as the latch arm 108 is pivoted into the unlatch position and the unlatch pawl 204 is pushed against the latch pawl pin 118.

The unlatch pawl 204 may be positioned at the first width edge 214 of the latch arm 108. The unlatch pawl 204 may also be positioned so that the latch arm 108 is pivotable when the component 102 is inserted into a component bay. The unlatch pawl 204 may also be positioned such that it contacts the latch pawl pin 118 when the latch arm 108 is in the unlatch position.

The unlatch pawl 204 may be constructed as an extension of the latch arm 108 so that a single piece of material makes up the unlatch pawl 204 and the latch arm 108. This may lower the cost and complexity of manufacture and may allow for a lower profile of the latch arm 108 and unlatch pawl 204. However the unlatch pawl 204 may also be constructed as a separate piece which is fastened to the latch arm 108 by one or more rivets, screws, roll pins, or other fasteners.

Referring to FIG. 4, the stabilizing member 206 may be constructed to provide a spring force when the stabilizing member 206 is deflected non-parallel to the plane of the latch arm 108. The stabilizing member 206 may be located within an area 209 of the latch arm 108 and may extend distally from the second width edge 216 of the latch arm 108 to connect to the pivot connector 208. The stabilizing member 206 may define an opening 210 which traces the stabilizing member 206 and is located within the area 209 of the latch arm 108.

The spring force of the stabilizing member 206 may allow for the component 102 to have compliance and flexibility against external shocks, vibrations, or other forces when inserted and latched within a component bay. Compliance and flexibility in the component bay may reduce the stress on the one or more connectors 104 while connected in the component bay.

Referring now to FIGS. 4, 5, and 6, in various alternative embodiments, the stabilizing member 206 may also be a toothed stabilizing member 302 having one or more teeth 303, 304 located on an outer edge of the toothed stabilizing member 302. The one or more teeth 303, 304 may form one or more pockets 305, 306 within the area 209 of the latch arm. The toothed stabilizing member 302 and the one or more pockets 305, 306 may increase the total area of the opening 210 which traces the toothed stabilizing member 302, and may allow for greater amounts of damping material 212, described further below, to be placed within the opening 210 and the one ore more pockets 305, 306. In FIGS. 5 and 6 at least one embodiment can be seen having a toothed stabilizing member 302 having two teeth 303, 304.

Referring again to FIG. 4, the material from which the stabilizing member 206 is constructed from may provide a source of such spring force. In at least one embodiment, the stabilizing member 206 was constructed from pre-tempered spring steel. The material from which the stabilizing member 206 is constructed may provide a source of the spring force. In at least one example, the stabilizing member 206 was constructed from pre-tempered spring steel.

Spring steel may be tailored to produce the desired spring force from deflection depending upon the shape, thickness and size of the stabilizing member 206 in order to achieve a desired spring force. In at least one example, a spring force of 15 pounds for a travel of 2 millimeters was achieved. The stabilizing member 206 may also be tapered from the second width edge 216 to the pivot connector 208 which may provide more efficient distribution of stress on the stabilizing member 206 and more efficient material utilization of the latch arm 108. In at least one example the stabilizing member 206 was tapered from a width of approximately 4 millimeters at the second width edge 216 to a width of approximately 2 millimeters at the pivot connector 208.

The stabilizing member 206 may be constructed as an extension of the latch arm 108 so that a single piece of material makes up the stabilizing member 206 and the latch arm 108. This may lower the cost and complexity of manufacture and may allow for a lower profile shape of the latch arm 108 and stabilizing member 206. However, the stabilizing member 206 may also be constructed as a separate piece which is fastened to the latch arm 108 by one or more rivets, screws, roll pins, or other fasteners.

Referring now to FIG. 4, the pivot connector 208 may allow the latch arm 108 an axis of rotation and may be the point at which the latch arm 108 is pivotally mounted on the component 102. The pivot connector 208 may be located within the area 209 of the latch arm 108 and connected to the stabilizing member 206. The pivot connector 208 may define an opening 210 which traces the pivot connector 208 and is located within the area 209 of the latch arm 108.

The pivot connector 208 may be shaped to allow for pivoting movement around an axis located at the center of the pivot connector 208. The pivot connector 208 may be shaped as a ring having an inner circumference and an outer circumference. However, the pivot connector 208 may also be shaped as a partial ring having an opening 210, or other shape which may allow for the latch pivot connector 208 to be mounted to the component 102, and to remain mounted while pivoting.

The pivot connector 208 may be connected to the stabilizing member 206 so that that a single piece of material makes up the stabilizing member 206 and the pivot connector 208. This may lower the cost and complexity of manufacture and may allow for a lower profile shape of the pivot connector 208 and stabilizing member 206. However, the pivot connector 208 may also be constructed as a separate piece which is fastened to the stabilizing member 206 by one or more rivets, screws, roll pins, or other fasteners.

Referring now to FIGS. 4, 5, and 6, in various alternative embodiments, the pivot connector 208 may also be a toothed pivot connector 308 having one or more teeth 309 located on an outer edge of the toothed pivot connector 308. The one or more teeth may form one or more pockets 310 within the area 209 of the latch arm. The toothed pivot connector 308 and the one or more pockets 310 may increase the total area of the opening 210 which traces the toothed pivot connector 308, and may allow for greater amounts of damping material 212, described further below, to be placed within the opening 210 and the one or more pockets 310. In FIGS. 5 and 6 at least one embodiment can be seen having a toothed pivot connector 308 having one tooth 309.

Referring now to FIGS. 4 and 5, damping material 212 may be inserted within the opening 210 which traces the stabilizing member 206 and pivot connector 208. Inserted damping material 212 may at least partially fill the opening 210. The inserted damping material 212 may also entirely fill the opening 210. In at least FIGS. 4 and 5, an embodiment is shown where the damping material 212 fills the entire opening.

The size of the opening 210 may allow for more or less damping material 212 to be placed within the opening 210. The damping material 212 inserted within the opening 210 may reduce the resonant frequency amplification of motion of the stabilizing member 206. The reduction in the resonant frequency of the stabilizing member 206 may depend upon the amount of damping material 212 and the type of damping material 212 used.

Inserted damping material 212 may be injected into the opening 210 and cured, placed within the opening 210, or inserted into the opening 210 by other methods. The damping material 212 may be selected from various types of material. The damping material 212 may be one or more selected from the group consisting of room temperature vulcanizing epoxy, room temperature vulcanizing silicone, room temperature vulcanizing rubber, and grease. The damping material 212 may also be a material having a durometer generally within the range of 15 to 70. The damping material 212 may also be other material which may reduce the resonance frequency of the stabilizing arm 206 when inserted into the opening 210.

The foregoing description of exemplary embodiments of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather determined in view of what would be apparent to those skilled in the art from the description provided herein and the claims appended hereto.

We claim:

1. A component and latch assembly comprising:
a component, latched to a component bay having a latch pawl pin;
the component having a first face and a second face, the first face and the second face being adjacent, perpendicular, and having a shared edge;
one or more connectors, positioned on the first face;
the latch assembly positioned on the second face, the latch assembly including the following features:
a mounting bracket, connected to the second face;
a handle pawl pin connected to the mounting bracket; and
a latch arm, having a first length edge, a second length edge, a first width edge, and a second width edge, connected to the mounting bracket and positioned so that the latch arm is sandwiched between the mounting bracket and the second face;
the latch arm being rotatable between a latched position and an unlatched position, the length edges parallel to the shared edge in the latched position and non-parallel to the shared edge in the unlatched position;
the latch arm including a latch pawl, a toothed pivot connector, and a toothed stabilizing member, and being positioned in a plane;
the latch arm, stabilizing member, pivot connector, and latch pawl being constructed from a single piece of spring steel;
the latch pawl being connected to the first width edge of the latch arm and providing spring force resisting deflection non-parallel to the plane;
the toothed pivot connector being formed within an area of the latch arm, having an inner and outer circumference and having one or more teeth forming one or more pockets within the area of the latch arm, the one or more teeth positioned on the outer circumference of the toothed pivot connector;
the toothed stabilizing member being formed within the area of the latch arm and extending distally relative to the second width edge to connect to the toothed pivot connector;
the toothed stabilizing member having one or more teeth forming one or more pockets within the area of the latch arm and providing spring force resisting deflection parallel to the plane;
a handle, connected to the latch arm, and connected to the second width edge;
a handle pawl, connected to the handle;
the handle being rotatable between a secured position and an unsecured position, the handle pawl and the handle pawl pin securing the latch arm from rotation in the secured position;
the toothed stabilizing member and toothed pivot connector defining an opening which traces the stabilizing member and pivot connector, and is located within the area of the latch arm; damping material, at least partially filling the opening, and having a durometer generally in the range of 15 to 70, wherein the damping material is one or more selected from the group consisting of room temperature vulcanizing epoxy, room temperature vulcanizing silicone, room temperature vulcanizing rubber, and grease; and an embossment positioned on the second face to deflect the latch pawl during latching of the latch arm such that the latch arm sits raised upon the embossment and engages the latch pawl pin in the latched position.

* * * * *